(12) United States Patent
Atkin

(10) Patent No.: US 8,613,879 B2
(45) Date of Patent: Dec. 24, 2013

(54) STAMPING METHODS AND DEVICES

(75) Inventor: Micah James Atkin, Glen Huntly (AU)

(73) Assignee: Mycrolab Diagnostics Pty Ltd, Melbourne (AU)

( * ) Notice: Subject to any disclaimer, the term of this patent is extended or adjusted under 35 U.S.C. 154(b) by 765 days.

(21) Appl. No.: 12/223,198

(22) PCT Filed: Jan. 24, 2007

(86) PCT No.: PCT/AU2007/000062
§ 371 (c)(1),
(2), (4) Date: Oct. 16, 2008

(87) PCT Pub. No.: WO2007/085044
PCT Pub. Date: Aug. 2, 2007

(65) Prior Publication Data
US 2010/0001434 A1    Jan. 7, 2010

Related U.S. Application Data

(60) Provisional application No. 60/761,746, filed on Jan. 25, 2006, provisional application No. 60/811,436, filed on Jun. 7, 2006.

(30) Foreign Application Priority Data

Jan. 24, 2006  (AU) ................................ 2006900345
Jun. 7, 2006   (AU) ................................ 2006903100

(51) Int. Cl.
*B29C 59/02*     (2006.01)

(52) U.S. Cl.
USPC ........... 264/296; 264/161; 264/163; 264/280; 264/284; 264/293; 264/294

(58) Field of Classification Search
USPC .......... 264/284, 293, 161, 163, 280, 294, 296
See application file for complete search history.

(56) References Cited

U.S. PATENT DOCUMENTS

| 53,922 | A | * | 4/1866 | Halsey et al. ................. 264/284 |
| 4,789,214 | A | | 12/1988 | Vilhelmsson et al. |
| 6,375,871 | B1 | * | 4/2002 | Bentsen et al. ................ 264/1.6 |
| 6,686,184 | B1 | | 2/2004 | Anderson et al. |
| 2005/0162733 | A1 | | 7/2005 | Cho et al. |
| 2007/0121375 | A1 | * | 5/2007 | Sewell .......................... 365/171 |

FOREIGN PATENT DOCUMENTS

WO    WO 2005/122285    12/2005

OTHER PUBLICATIONS

International Search Report for PCT/AU2007/000062, completed Feb. 26, 2007.

* cited by examiner

*Primary Examiner* — Timothy Kennedy

(57) ABSTRACT

A method of forming a stamped feature (P) on a substrate (S) includes: applying a plurality of stamping tool segments (32, 40a, 40b, 40c, 50, 60, 70, 80, 92) to at least one surface of the substrate. An arrangement (30, 90) for forming a stamped feature (P) on a substrate (S) includes a plurality of stamping tool segments (32, 40a, 40b, 40c, 50, 60, 70, 80, 92) that actuatable individually, in concert in groups of more than one, or combinations thereof.

25 Claims, 28 Drawing Sheets

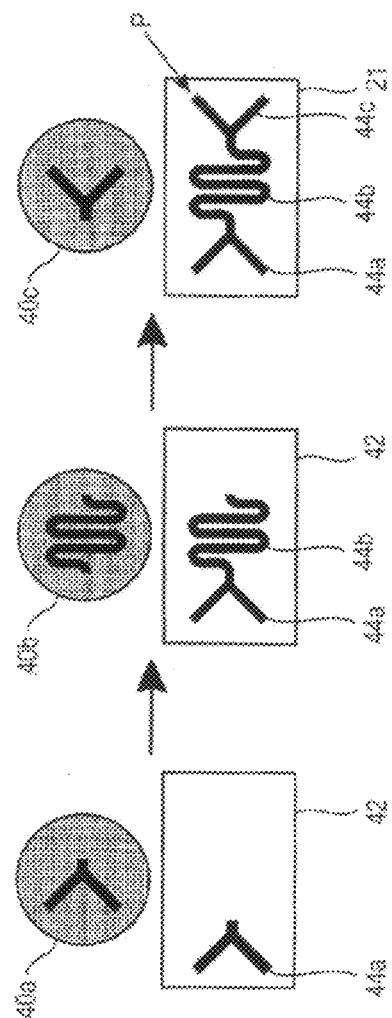

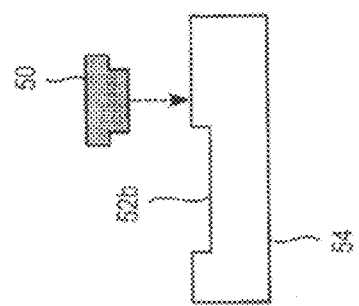
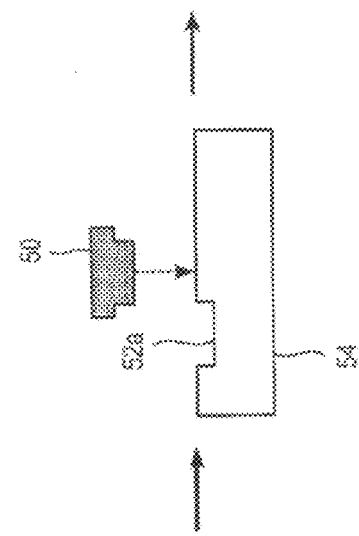
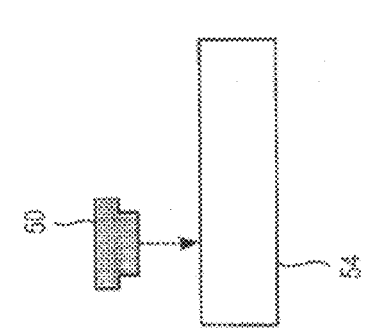

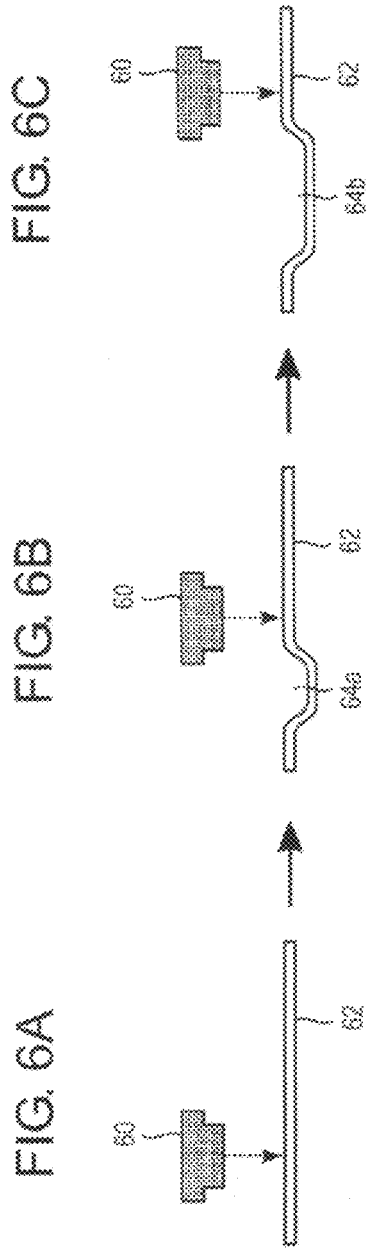

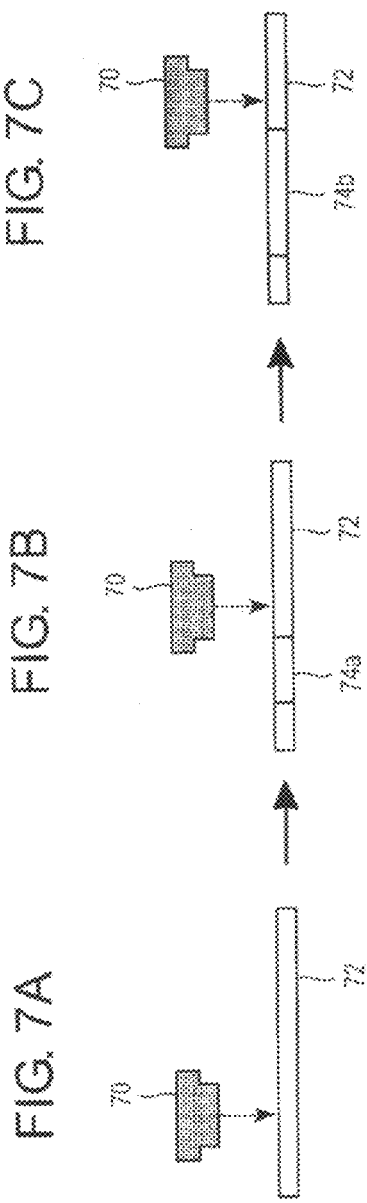

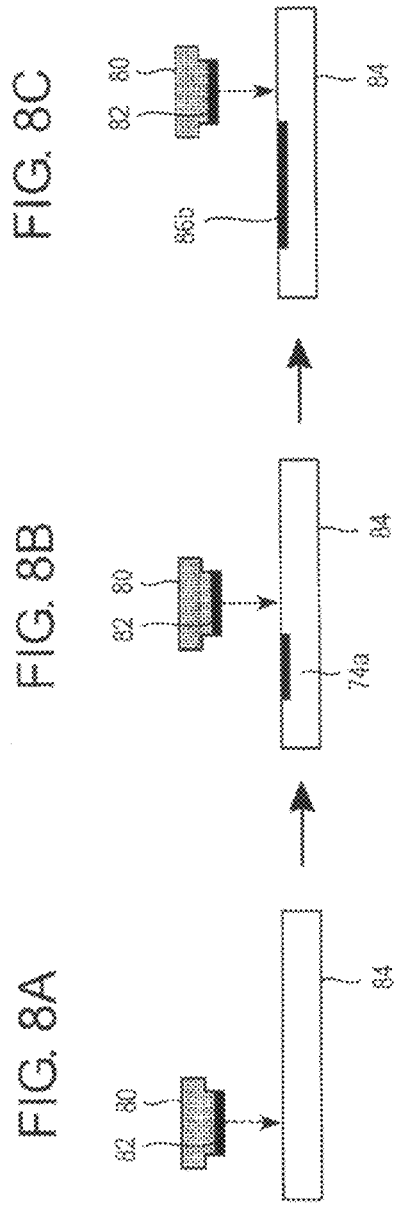

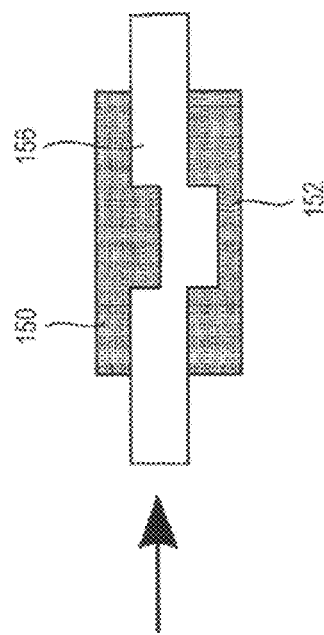
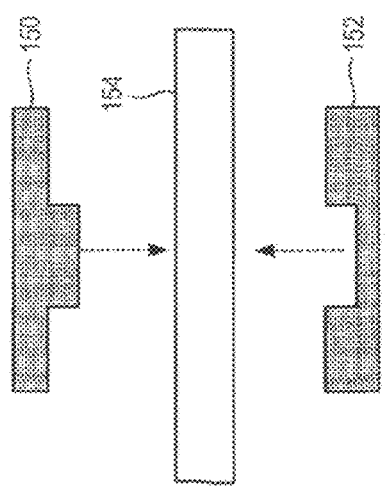

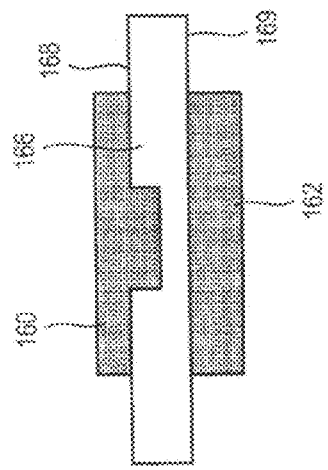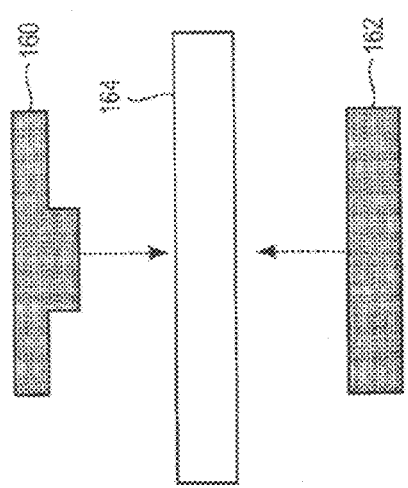

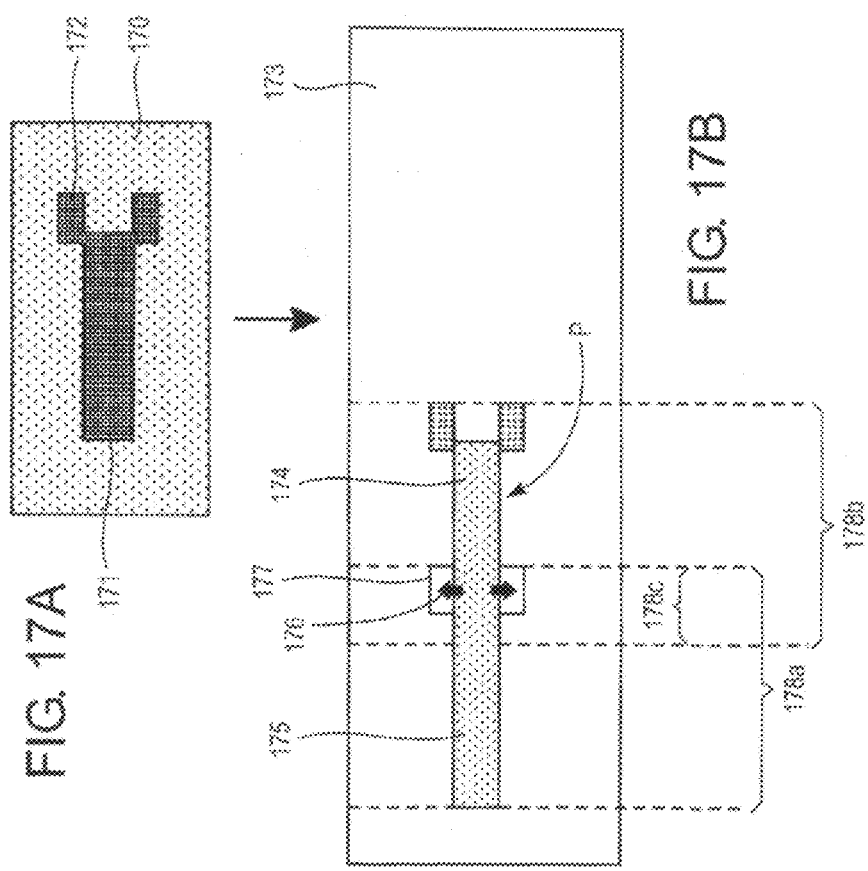

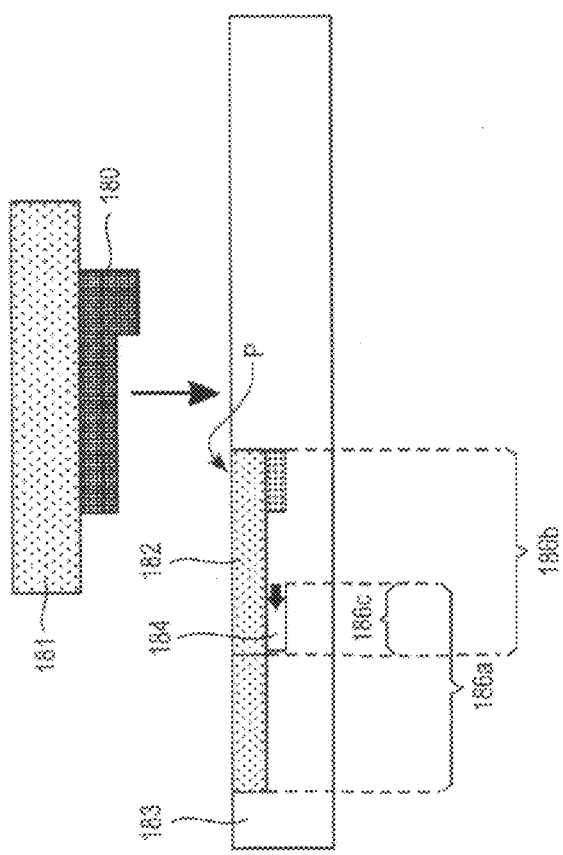

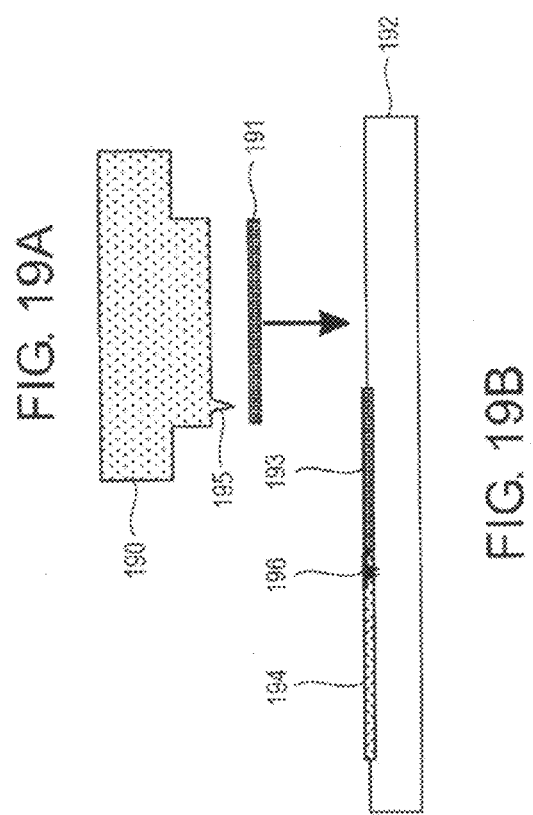

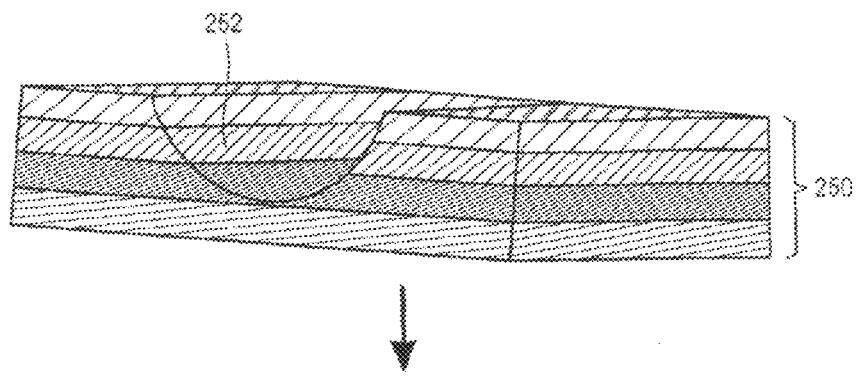
FIG. 25A
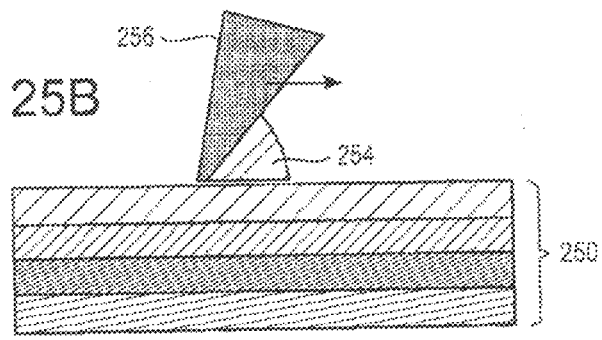
FIG. 25B
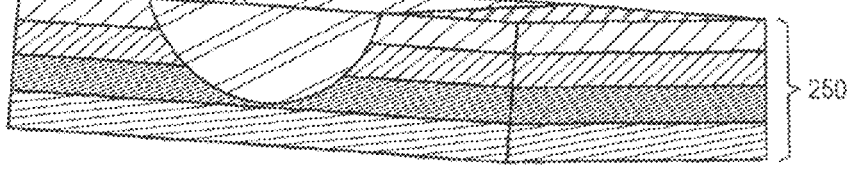
FIG. 25C

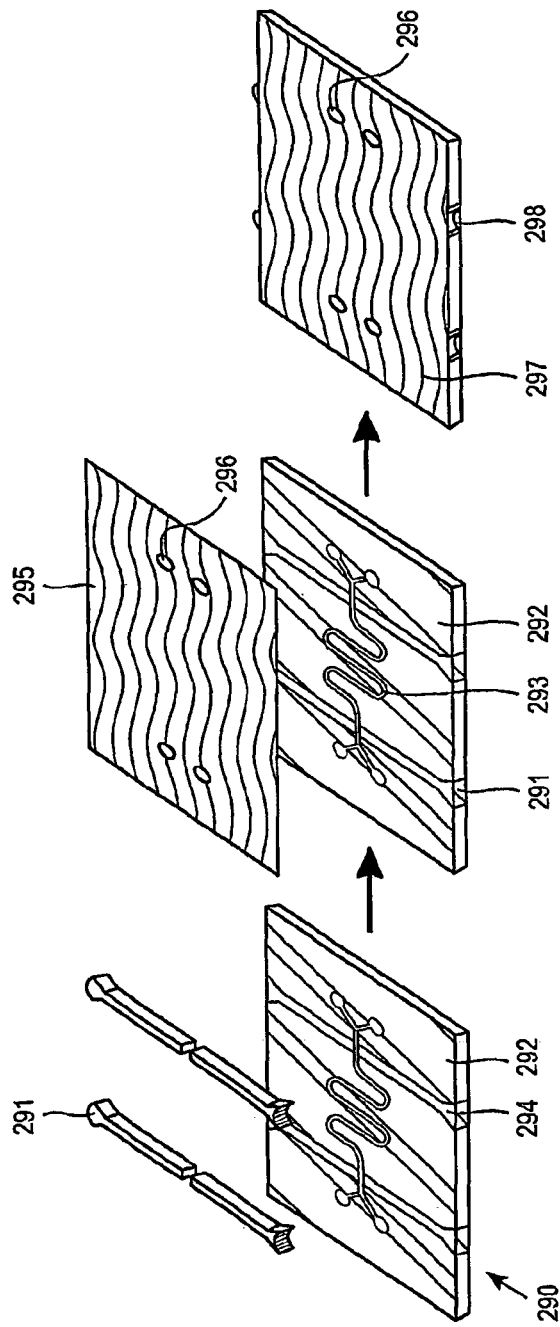

STAMPING METHODS AND DEVICES

CROSS-REFERENCE TO RELATED APPLICATIONS

This application is the National Stage of International Application No. PCT/AU2007/000062, filed Jan. 24, 2007, which claims priority to U.S. Application 60/761,746, filed 25 Jan. 2006, the entire contents of which are incorporated herein by reference. This application also claims priority to U.S. Application 60/811,436, filed 7 Jun. 2006, the entire contents of which are incorporated by reference. This application also claims priority to Australian Application 2006903100 filed 7 Jun. 2006, the entire contents of which are incorporated by reference. This application also claims priority to Australian Application 2006900345, filed 24 Jan. 2006, the entire contents of which are incorporated by reference.

FIELD

This invention relates generally methods and devices for stamping materials during manufacturing processes. The field of this invention also relates to the manufacture of fluid handling components, optical light guides, the deposition of metal, chemical and biological surface coatings, and the formation of electrical and heat conductive structures.

BACKGROUND

In the discussion that follows, reference is made to certain structures and/or methods. However, the following references should not be construed as an admission that these structures and/or methods constitute prior art. Applicants expressly reserve the right to demonstrate that such structures and/or methods do not qualify as prior art.

Stamping techniques include graphic transfer, embossing, forming, cutting, and the transfer of materials onto or into a substrate, such as with hot stamping for transfer of patterns of foils and the deposition of chemical or biochemical reagents by contact printing, for example the deposition of inks and biological sensor molecules. Stamping processes typically replicate a pattern into, onto, or through, a substrate by the application of a patterned tool.

Embossing is a technique in which a stamping tool is pressed into a substrate, and causes material around the tool to shift and form a replicated structure in the substrate. The replicated structure produced is a negative image of the embossing tool. Forming is a similar technique to embossing and usually performed on substrates that are thinner than the structure to be patterned, a common example is that of blister packaging. Die cutting also involves the application of a patterned tool, however it typically cuts partially or wholly through the substrate around the pattern outline of the tool. The hot foil stamping method can be used to transfer a thin film, such as a metallic or graphic layer, from a carrier layer onto a substrate. The process usually involves bonding of the deposited layer onto the substrate by temperature and pressure, which also induces release of a coating from the carrier tape. Stamping foil is often used in processes which involve deposition of metallic layers for decorative coatings. Such metallic layers are typically produced on carrier tapes, such as polyester, with a wax release that melts at the stamping temperature. Similarly, the contact printing process transfers a material, often in the form of a liquid, from the stamping tool onto the substrate surface.

Prior art devices and methods for the stamping of materials typically involve the use of a specifically patterned tool that is used to form an entire patterned structure or area. An example is in microoptics and microfluidics in which a tool is made to replicate the entire desired pattern. The limitation with this approach is that an entirely different tool is required for each different pattern that is needed.

In some stamping situations such as embossing, the quality of replication is dependent on factors such as time, pressure, and temperature. Consequently, the size of the pattern to be replicated is limited by the processing machine's capabilities. As the size of the pattern to be replicated increases so do the force and dwell time required to shift the material from the replicated area. For larger structures this becomes more difficult as the material shifted when embossed is required to flow to other regions within the bulk material. Problems of material relaxation and stress after the embossing process can cause the replicated structures to deform.

Development of embossing processes for forming microfluidic structures started in the late 1990's using imprinting or stamping processes. High aspect ratios are often required to form such structures. A hot embossing process was developed to help structure replication and is commonly used in the research environment, as described in: Becker et al., "Polymer microfabrication methods for microfluidic analytical applications", Electrophoresis 2000, volume 21, pages 12-26; Becker et al., "Polymer microfluidic devices", Talanta 2002, pages 267-287; and Heckele et al., "Review of on micro molding of thermoplastic polymers,", J. Micromech. Microeng. 2004, Volume 14, Number 3, pages R1-R14. The hot embossing process is a subset of the standard embossing process except that the temperature of operation is typically close to the material's glass transition temperature and the embossing pressures are lower. As with all embossing techniques, the quality of the replicated structures is dependent on several parameters including imprinting pressure, temperature, time and material properties. A problem with this technique is the difficulty and time required for temperature cycling to achieve the high aspect ratio structures, and the tendency for larger structures to trap air bubbles. Furthermore, there are limited materials suitable for this process, which in turn limits the number of materials available with suitable bulk and surface properties for product applications.

High-throughput production techniques that have been developed typically involve the use of reel-to-reel production systems for part fabrication of films. Examples of these include British Patent Application No. 9623185.7, which describes a UV curing process evolved from the optics industry for microstructuring films. The process works by coating the substrate with a thin UV-curable resin, then using a master template to emboss the pattern and cure the resin during contact with the template. U.S. Pat. No. 6,375,871 describes an extrusion process onto a film followed by roller embossing of the laminate or resin on the web. U.S. Pat. No. 6,375,776 describes a forming tool for use on a web system for microstructuring films. The main limitations with these techniques are that: they are limited to relatively thin substrates, or films, for operation on a web; have limited materials available that are suitable for this process, which in turn limits the number of materials available with suitable bulk and surface properties for product applications; require separate relatively expensive tooling for each pattern; and there are generally long setup delays associated with tooling changes.

The formation of conductive circuits on a substrate is usually performed via etching, screen printing, or electroplating processes. All of which are relatively expensive for small production runs due to the associated tooling and operational costs. Milling of electroplated substrates is a well-known alternative for rapid prototyping but is limited in dimensional capabilities and requires planar substrates, of which there are few commercially available materials.

Contact printing has been commonly used for the patterning of small quantities of liquids onto a surface. These liquids include inks and other chemicals or biological reagents for applications such as: information encoding, as with text; decorative or protective coatings; altered surface properties for wetting and bonding, including hydrophilicity, permeability, surface energy, and altering the molecular surface; and the deposition of reagents for sensor or actuator fabrication.

A main disadvantage with all of these production techniques is the time and cost associated with setting up the tooling required for a new pattern, and the operational cost for small production runs. With larger production runs these costs can be amortised over the number of parts fabricated, but for small production runs the individual part cost becomes prohibitively expensive.

Furthermore larger structures are problematic to stamp without substantially modifying existing equipment, and process dwell times are often increased with the size of the structure.

Thus, there is a need in the art for low cost arrangements and methods for stamping of individual parts or small production runs with different patterns, without requiring pattern-specific tooling. There is also a need for tooling arrangements and methods capable of producing larger patterned areas without increasing the size, cost, or complexity of existing machinery.

The reference to any prior art in this specification is not, and should not be taken as, an acknowledgement or any form of suggestion that the prior art forms part of the common general knowledge.

SUMMARY

The invention includes apparatus, arrangements, methods and products relating to improved stamping during manufacture. The present invention can provide advantages that may include one or more of reduced development time; reduced actuation force required to stamp; reduced processing time; cost reduction; flexibility of production; improved stamping performance for larger structures; and enabling mass customization of parts.

According to one aspect of the present invention, there is provided a method of forming a stamped feature on a substrate, the method comprising (i) applying a plurality of stamping tool segments to at least one surface of the substrate. As used herein, the terms "stamping elements" and "tool segments" are used interchangeably, as are the terms "stamped feature" and "stamped pattern."

According to one embodiment, the method comprises applying a first stamping tool segment to at least one surface of the substrate thereby forming a first sub-pattern thereon, and applying a second stamping tool segment to at least one surface of the substrate thereby forming a second sub-pattern thereon. The stamping elements may create the stamped feature by any suitable means. For example, they may together correspond to the stamped feature, and/or together comprise a stamping tool.

Furthermore, the first sub-pattern and the second sub-pattern may be the same or different and may optionally at least partially overlap or join. In some embodiments, they combine to form a stamped feature.

Processes, apparatus and arrangements according to the invention are suitable for a wide range of manufacturing settings, for example web-based (continuous) and sheet-based (discreet) substrate settings.

As used herein, "stamping" refers to processes or techniques of forming structures and/or patterns on or in a substrate, and includes, for example: embossing, forming, cutting, hot stamping (e.g. foil), the transfer of patterns of materials, using a stamp, and contact printing.

Furthermore, processes of the present invention may further comprise at least one of a pre or post stamping treatment process.

Alignment of the various items involved in stamping, such as the stamping elements, the substrates and any components thereof, may be achieved in any suitable manner. For example, a control system may be used and alignment may be achieved using one or more of alignment marks, notches, grooves, edge guides, and mechanical, optical, thermal, or sound based sensors. Such sensors, or sensor systems, may involve discrete sensory sites or image an area, and may be combined with signal processing techniques, such as with image recognition.

The stamping process may itself be undertaken by a stamping machine which may comprise a plurality of stamping elements. In some embodiments, the stamping machine is itself fully automated.

Stamped features produced according to processes of the invention may take various forms. For example, they may optionally form patterns by overlapping on the same or separate layers of a substrate. Furthermore, the stamped features or patterns may comprise either indented or raised features and be produced by corresponding raised or indented stamping elements.

In some embodiments, a plurality of stamping elements act in concert to create a stamped feature. For example, they may stamp on a plurality of surfaces and stamping elements may act in concert, such as matched in pairs or groups.

Other elements may be added to the process by which greater quality can be achieved, for example, by utilizing an element comprising at least one special feature to avoid deformation of the stamped substrate. By way of example, such a special feature may comprise a wide tooling support for the substrate around the structured feature, or the use of sacrificial structures to control material flow during subsequent stamping actions.

Certain embodiments of apparatus, arrangements and methods of the invention are particularly suited for certain applications, such as the manufacture of microfluidic components or devices, electronic circuits, conductive features, electromagnetic structures, waveguide, light pipe, sensors, actuators, or similar structures.

As used herein, "microfluidic" refers to a component, system or method that includes fluid handling structures or elements that have dimensions on the micron or submicron scale. For example, such structures or elements can have at least one dimension in the order of about 0.1-microns to about 1000 microns.

Furthermore, in some embodiments, the invention is suitable for such applications as surface treatment, sensor fabrication, or decorative or text detailing.

In a further aspect of the invention, there is provided an arrangement for forming a stamped feature on a substrate, the arrangement comprising a plurality of stamping tool segments that are actuable: individually; in concert in groups of more than one; or combinations thereof. In some embodiments operation of the arrangement is at least partially automated. Furthermore, the plurality of stamping tool segments may be mounted to a structuring wheel or machine head via respective actuators.

In some embodiments, the arrangement comprises a mounting system that permits movement of the structuring wheel or machine head in at least two directions. The substrate may also move relative to the stamping tool.

In some embodiments, the apparatus comprises a plurality of stamping elements that together-correspond to the stamped feature. The plurality of stamping elements may together comprise a stamping tool which may itself be automated.

Throughout this specification (including any claims which follow), unless the context requires otherwise, the word 'comprise', and variations such as 'comprises' and 'comprising', will be understood to imply the inclusion of a stated integer or step or group of integers or steps but not the exclusion of any other integer or step or group of integers or steps.

BRIEF DESCRIPTION OF THE DRAWINGS

FIGS. 4A-4C illustrate an embossing arrangement and technique involving the successive application of three stamping elements to form an embossed pattern.

FIGS. 5A-5C illustrate an arrangement and technique whereby a stamping element is applied sequentially to a substrate to form an embossed pattern.

FIGS. 6A-6C illustrate an arrangement and technique whereby a stamping element is sequentially applied to a substrate in a forming operation.

FIGS. 7A-7C illustrate an arrangement and technique whereby a stamping element is sequentially applied to the substrate thereby performing a cutting operation.

FIGS. 8A-8C illustrate an arrangement and technique whereby a stamping element is sequentially applied to a substrate thereby performing a deposition operation.

FIGS. 15A-15B illustrate an arrangement and technique for applying an embossed pattern to opposing sides of a substrate according to the present invention.

FIGS. 16A-16B illustrate an arrangement and technique for applying an embossed pattern to a substrate according to a further aspect of the present invention.

FIGS. 17A-17B illustrate an arrangement and technique for applying an embossed pattern to a substrate which includes the use of relief structures on an embossing tool according to one aspect of the present invention.

FIGS. 18A-18B illustrate a side view of an arrangement and technique for applying an embossed pattern to a substrate which includes the use of relief structures on the embossing tool, according to a further aspect of the present invention.

FIGS. 19A-19B is a side view illustrating an arrangement and technique for depositing a material onto a substrate according to yet another aspect of the present invention.

FIGS. 25A-25C are side views of an arrangement and technique for forming a microoptic structures onto a substrate according to the principles of the present invention.

FIGS. 29A-29C illustrate an arrangement and technique for incorporating separately fabricated waveguide components into formed channels of a substrate according to the principles of the present invention.

DETAILED DESCRIPTION

It is convenient to describe the invention herein in relation to embodiments relating to microfluidic devices and electronic circuits. However, the invention is applicable to a wide range of situations and products and it is to be appreciated that other applications, constructions and arrangements are also considered as falling within the scope of the invention.

Arrangements and processes of the invention overcome limitations of traditional stamping, generally by segmenting the tool into multiple stamping tool segments or elements.

Stamping processes typically replicate a pattern into, or on, a substrate by the application of a single patterned tool. By using a plurality of stamping tool segments or elements to create a continuous stamped pattern or feature the tools can be standardized, forming generic pattern sets. This allows for the customized production of stamped products using the same tools, thereby avoiding tooling changes and thus reducing the cost of small or single part production runs.

Advantages of apparatus, arrangements and methods of the invention may include one or more of:

reduced development time by using combinations of standardized components or tool sets to fabricate each new design;

reduced actuation force required to stamp a pattern onto a substrate by stamping smaller subpatterns separately;

higher throughput in some cases due to reduced dwell times from embossing or forming smaller structures;

cost reduction by replacement of smaller less complex individual tool elements or segments instead of replacing a complex tool for the entire pattern;

flexibility of production reducing the cost for small or single part production runs, and allowing mass customization of stamped products;

improved quality for larger structures as less material needs to be deposited or shifted using segments; and a new paradigm of part personalization or mass customization for applications such as microfluidics, identification card embossing, and the like.

Polymers and metals may be stamped or incorporated into stamped products according to the present invention. Any suitable materials may be used. Other materials that may be utilized include but are not limited to: silicon, metal oxide; metal foil; paper; nitrocellulose; glass; photoresist; ceramic; wood; fabric based products; and combinations thereof.

Figure 1:
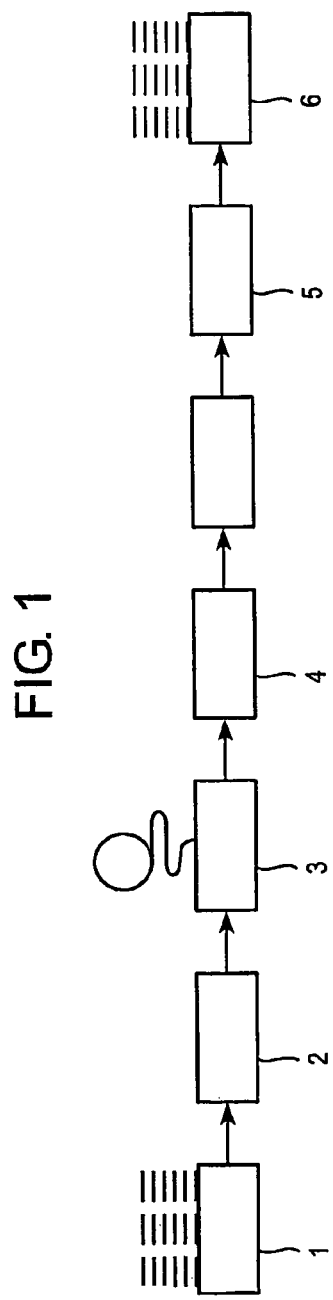
FIG. 1 is a schematic illustration of a card or sheet production system.
Figure 2:
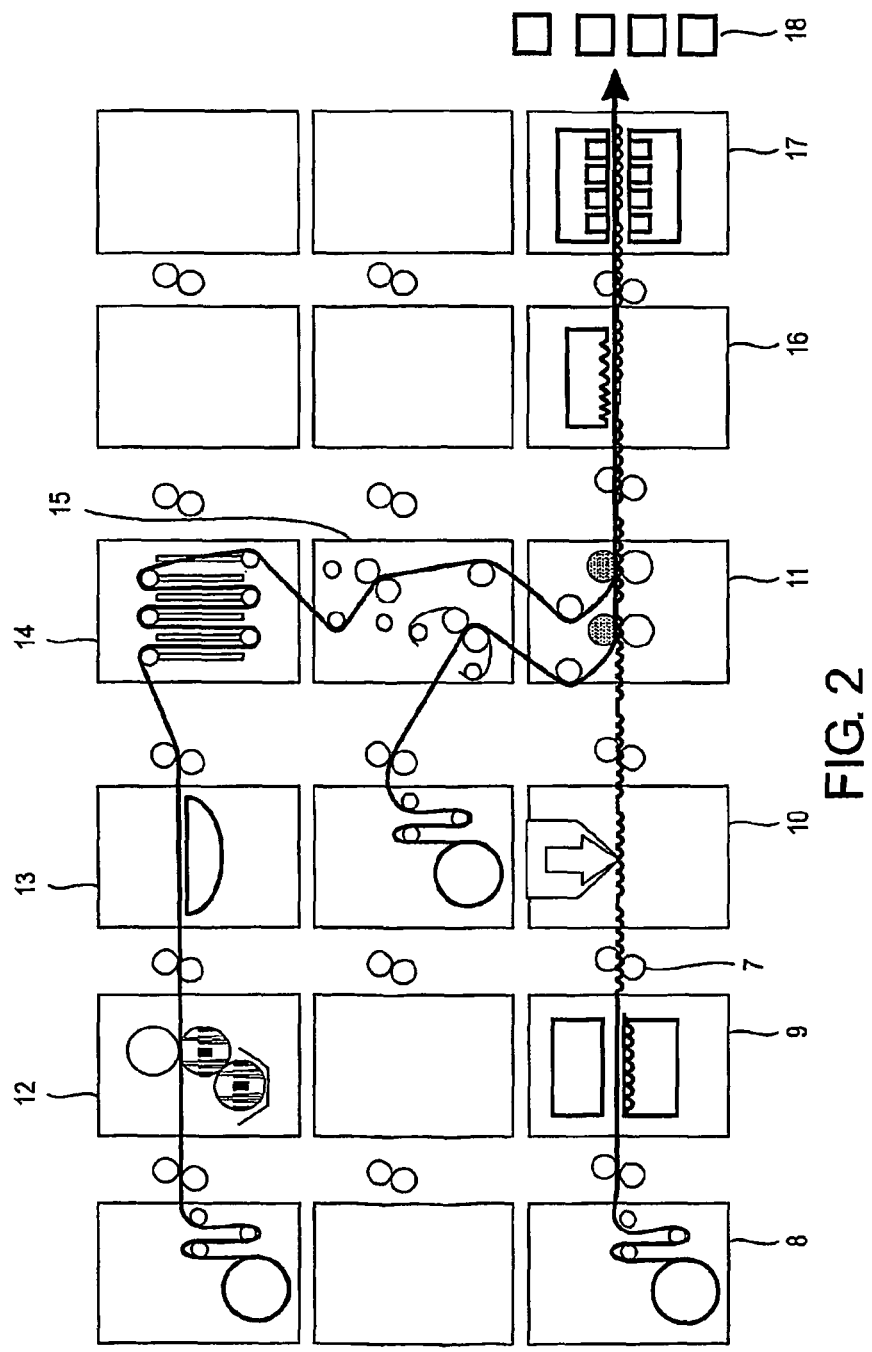
FIG. 2 is a schematic illustration of a web or continuous substrate production system.

Stamped products may be fabricated on discrete substrates or onto continuous rolls of substrate material. FIG. 1 shows one embodiment of a production line used to structure discrete products such as cards. In this example, in the form of a discrete substrates in card stock the input hopper (1) is sequentially passed through printing (2), embossing (3), laminating (4) and programming (5) stations before loading into output hoppers (6). An example of a production line for the fabrication of continuous product, or onto a web roll, is illustrated in FIG. 2. In this example of a continuous production line, processing modules are interspersed with material feed handlers (7) and perform the following operations: forming stock material input (8); forming (9); filling (10); bonding (11); printing (12); curing (13); tension control (14); material guides & unwinds (15); embossing and perforating (16); die cutting (17); and final part collection (18).

Figure 3:
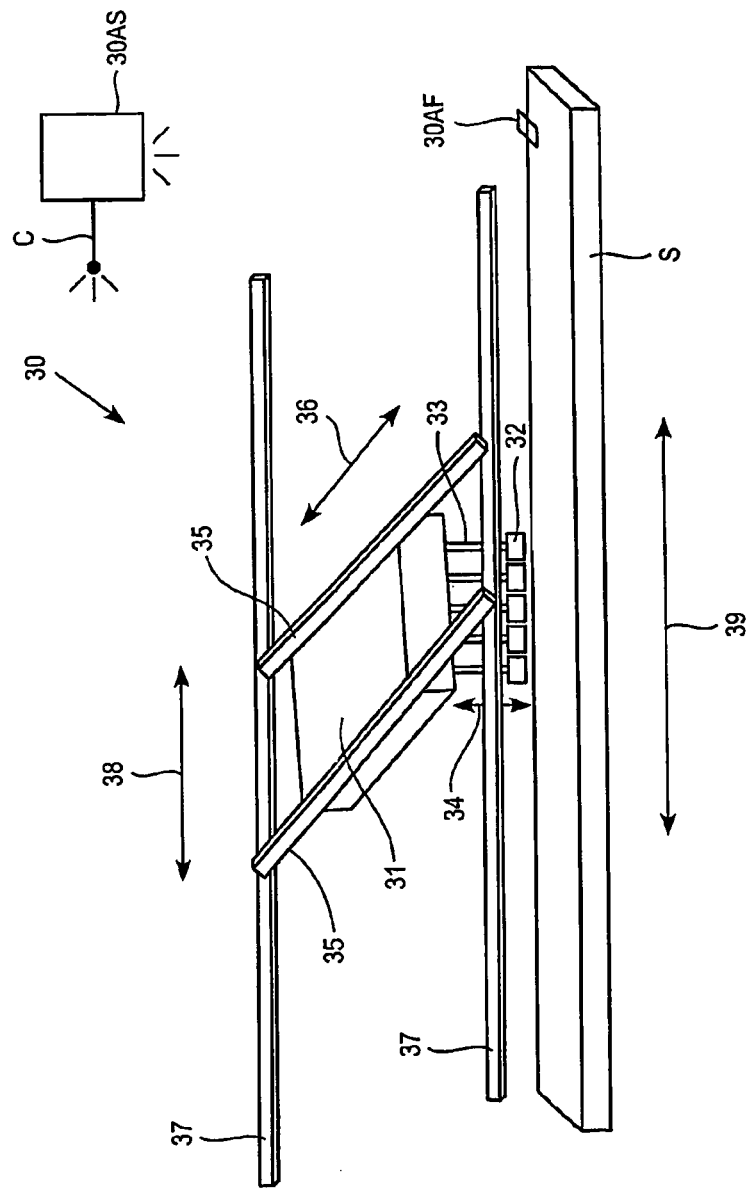
FIG. 3 is a schematic illustration of an arrangement including an automated stamping machine according to one aspect of the present invention.

As illustrated in FIG. 3, according to one embodiment of the present invention, there is provided an arrangement (30) which includes an automated stamping machine. The arrangement (30) illustrated in FIG. 3 is depicted for purposes of illustration only. As illustrated therein, the arrangement (30) comprises a structuring wheel or machine head (31) which can be computer controlled. A plurality of stamping elements or tool segments (32) are attached thereto via individual actuators (33). While only a limited number of stamping elements or tool segments are illustrated in FIG. 3, it should be understood that many more tool segments can be present in a number of different arrays or configurations. Such additional arrays or configurations are also contemplated by the present invention. The structuring wheel or machine head (31) is capable of driving the actuators (33) either individually, or as a plurality in concert with one another. The precise mechanisms for driving the actuators (33) are believed to be well within the capabilities of those skilled in the art. Suitable actuation mechanisms include; but are not limited to: mechanical arrangements; electromechanical arrangements; and pneumatic arrangements. As further illustrated in FIG. 3, the stamping elements (32) and their respective actuators (33) are movable in the direction indicated by arrow (34). The structuring wheel or machine head (31) can be mounted by any suitable arrangement, such as the illustrated pair of rails (35). The structured wheel or machine head (31) is relatively movable with respect to the mounting rails (34) as illustrated by the arrow (36). The rails (35) may optionally be mounted to a pair of transverse rails (37). The rails (35) are relatively movable with respect to the transverse rails (37) as indicated by arrow (38). Thus, according to the illustrated embodiment, the structuring wheel or machine head 31, and its associated stamping elements or tool segments (32) are relatively movable in at least three different directions with respect to a substrate (S). The above mentioned relative movement between rails and a structuring wheel or machine head can be accomplished by any suitable mechanism, which is well within the capabilities of those skilled in the art. Suitable mechanisms include, but are limited to: servomotors, electromechanically engaged pulley systems; and the like. In addition, or as an alternative, the arrangements (30) may include a mechanism by which the substrate (S) can be moved relative to the structuring wheel or machine head (31), as indicated by arrow (39), this relative movement can be in the longitudinal direction, relative to the substrate (S). Any suitable mechanism may be provided to accomplish movement of the substrate (S). The implementation of such mechanisms be well within the capabilities of those skilled in the art, suitable mechanism for moving the substrate include, but are not limited to: a conveyor arrangement or conveyor belt. In some embodiments, there is provided the use of ID card personalisation style systems. In such systems, the card is passed through roller nips between various processing stations, including past an embossing station that has an embossing wheel of characters. In some instances the card may pass (x-axis) the head (z-axis), and in others both the head (y-z-axis) and the card move (x-axis).

Optionally, the arrangement (30) further includes an alignment mechanism or system for facilitating the positioning of the stamping elements (32) relative to the substrate(s). For example, an alignment feature (30AF) can be detected or read by an alignment sensor (30AS), which can then produce a control sign (C) that can initiate or terminate movement relative to the substrate(s). The alignment feature 30(AF) can comprise surface or bulk material discontinuities or structures, marks, notches, grooves or edge guides. In an alternative arrangement, the sensor (30AS) is an imaging sensor and pattern recognition is used to determine alignment and/or quality control issues.

As noted above, according to one aspect of the present invention, the stamping elements or tool segments can be actuated in unison to apply a selected pattern to a substrate. Alternatively, as illustrated in FIGS. 4A-4C, a selected pattern (P) can be applied to a substrate by the sequential application of a plurality of different stamping elements or tool segments such that the selected pattern (P) is defined by a plurality of overlapping or joining subpatterns. Thus, as illustrated in FIG. 4A, a first stamping element or tool segment (40a) is applied to the substrate (42) thereby forming a first subpattern (44a) thereon. Next, as illustrated in FIG. 4B, after application of the first subpattern (44a), a second stamping element or tool segment (40b) is then applied to the substrate (42) resulting in the application of a second subpattern (44b) which at least partially overlaps or joins the first subpattern (44a). Subsequently, a third stamping element or tool segment (40c) is applied to the substrate 21 resulting in the application of a third subpattern (44c) thereon. The third subpattern (44c) at least partially overlaps or joins the second subpattern (44b). Thus, the three sequentially applied subpatterns (44a, 44b, 44c) combine to form the selected pattern (P) on the substrate (21).

In another embodiment, the same stamping element, or different stamping elements having the same stamping pattern, can be used sequentially to form overlapping or joining subpatterns on the same layer or separate layers of a substrate. FIGS. 5A-8C illustrate the sequential use of a tool segment for embossing (FIGS. 5A-5C), forming (FIGS. 6A-6C), cutting (FIGS. 7A-7C), and deposition (FIGS. 8A-8C).

In FIGS. 5A-5C, the tool (50) embosses subpatterns (52a, 52b) into a substrate (54) leaving a patterned surface. In FIGS. 6A-6C, the tool (60) forms subpatterns (64a, 64b) in the substrate (62) leaving a blister formed area. In FIGS. 7A-7C, the tool (70) cuts subopenings (74a, 74b) in the substrate (72) removing the patterned area. In FIGS. 8A-8C, the tool (80) presses a material (82) into or onto the substrate (84) surface leaving subdeposits (86a, 86b) which together form a patterned area of deposited material when the tool is removed.

Figure 9:
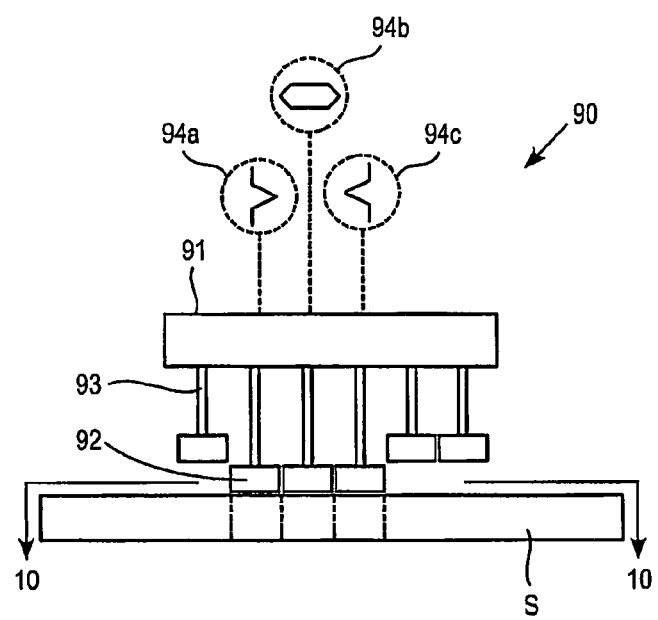
FIG. 9 is a schematic illustration of an arrangement and technique for applying a stamped pattern to a substrate by application of a plurality of stamping tool segments in concert in order to apply a desired pattern.
Figure 10:
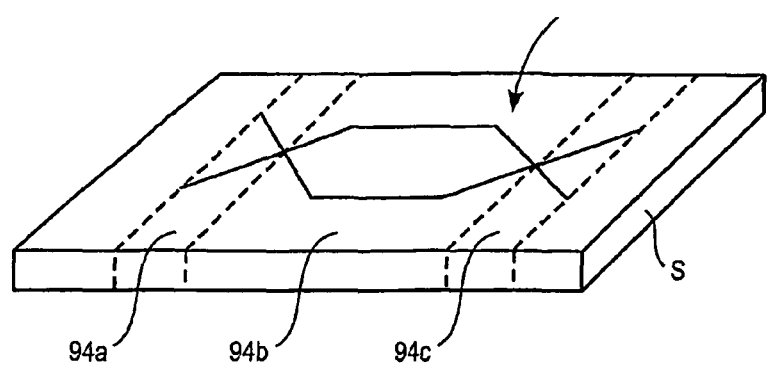
FIG. 10 is a view taken along line 10-10 of FIG. 9 illustrating the top of the substrate having a selected stamped pattern applied thereto.

A further embodiment of the present invention is illustrated in FIGS. 9-11B. The arrangement (90) depicted therein is similar in construction and operation to the previously described arrangement (30) depicted in FIG. 3. Thus, reference is made to the previous description of arrangement (30) for a detailed discussion of the various elements and components thereof. According to the arrangement (90) and technique illustrated in FIGS. 9-11B, a plurality of stamping elements or tool segments (92) are actuated in unison by a structuring wheel or machine head (91) via a respective actuator (93) in order to apply a respective subpattern (94a, 94b, 94c) to one or more surfaces of a substrate (S). As illustrated in FIG. 9, all of the stamping element tool segments (92) which are required to form a described pattern (P) are actuated simultaneously and applied to a surface of the substrate (S), thereby applying all of the individual subpatterns (94a, 94b, 94c) necessary to define a selected pattern (P; FIG. 10).

Figure 11A:
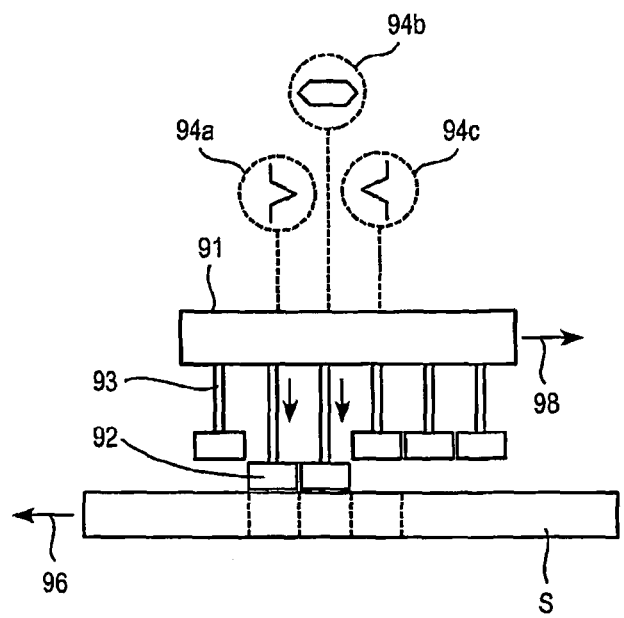
FIGS. 11A-11B illustrate an arrangement and technique for applying a selected stamped pattern to a substrate which involves the operation of a plurality of stamping tool segments together in unison according to a further aspect of the present invention.
Figure 11B:
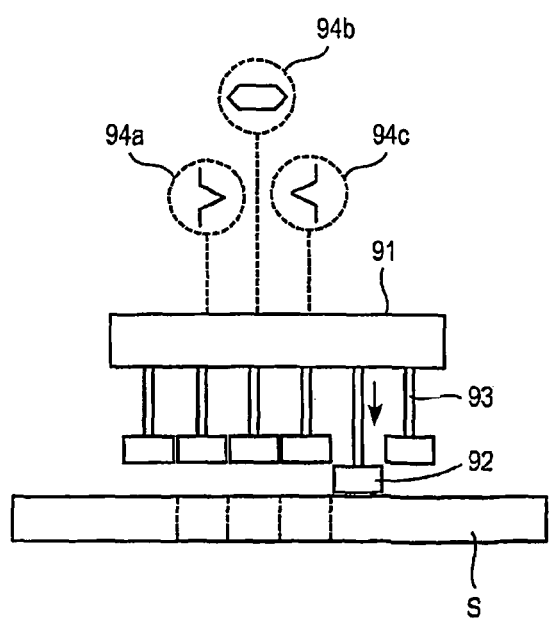

A modification of this arrangement and technique is illustrated in FIGS. 11A-11B. As illustrated therein, at least one plurality of stamping elements or tool segments (92), are applied simultaneously to at least one surface of a substrate, followed in a sequential step by the application of one or more additional stamping elements or tool segments (92) in order to complete the selected pattern (P). More specifically, as illustrated in FIG. 11A, a first plurality of stamping elements or tool segments (92) are applied to a surface of the substrate (S) thereby transferring subpatterns (94a, 94b) to the surface of the substrate (S). Subsequently, the relative position of the substrate to the structuring wheel or machine head (91) is changed. This shift in position can be affected by either shifting the substrate(s), as indicated by arrow (96), or by shifting the structuring wheel or machine head (91), as indicated by the arrow (98). This movement can be controlled by an alignment system, as previously described. As illustrated in FIG. 11B, once the relative position of the structuring wheel or machine head (91) relative to the substrate (S) has been completed, at least one additional stamping element or tool segment (92) is actuated via a respective actuator (93) to apply one or more additional subpatterns (94c) to a surface of the substrate (S) thereby completing the selected pattern (P; FIG. 10). While only two steps have been illustrated according to the above exemplary embodiment, it should be understood that additional steps which involve the actuation of one or more stamping elements or tool segments, either individually, and/or as a group in unison with one another.

Figure 12:
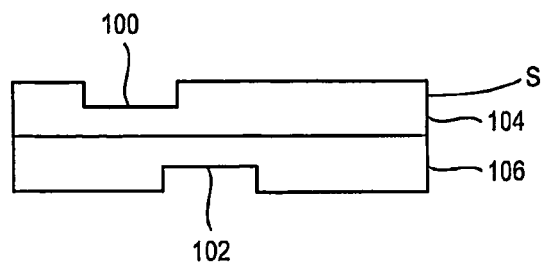
FIG. 12 is a side view of an overlapping embossed pattern formed according to the principles of the present invention.
Figure 13:
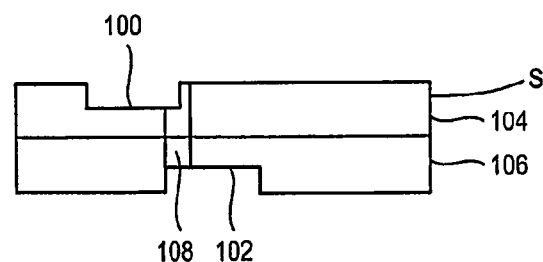
FIG. 13 is a side view of the substrate having an overlapping embossed pattern applied thereto according to a further aspect of the present invention.
Figure 14:
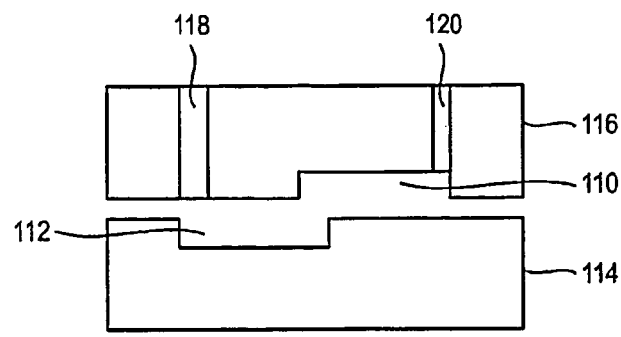
FIG. 14 is a side view of a plurality of substrates having overlapping embossed patterns applied thereto according yet another aspect of the present invention.

Embossed structures overlapping on different surfaces or layers are shown in FIGS. 12-14. FIG. 12 shows overlapping structures (100, 102) on separate layers (104, 106) of the same substrate (S). FIG. 13 illustrates a hole (108) through the substrate (S) connecting the two structures (104, 106). FIG. 14 illustrates overlapping structures (110, 112) on adjoining surfaces of two substrates (114, 116), the structures (110, 112) are joined together in the overlapping region and contain entry/exit ports (118, 120). The stamped or embossed structures may also form parts of, or incorporate, structures fabricated from other methods. FIGS. 12-14 illustrate examples of stamped or embossed structures that overlap with other structures for microfluidics, where the embossed regions are connected to holes (108, 118, 120) through the substrate. The holes may be fabricated prior to or after the surface structuring performed according to the present invention. The holes can be formed by other techniques.

In some embodiments the stamping or embossing characters may include positive and/or negative patterned features on the stamping elements or tool segments and may operate as matched pairs or groups. The example shown in FIGS. 15A-15B illustrate the operation of matched positive (150) and negative (152) tool segments for raised pattern formation. In this example, the tool segments (150, 152) are brought together with the substrate (154) in between, causing the substrate (154) to form around the tools producing a patterned material (156) when the tools are removed. Other embossing examples include actuating a stamping element (160) into a substrate (164) with a supporting flat tool (162) to avoid deformation on the side opposite to the pattern, as illustrated in FIGS. 16A-16B where the patterned substrate (166) contains patterned (168) and flat (169) sides.

In certain preferred embodiments the stamping tools contain specialized features to avoid deformation of the substrate and adjacent structures. Tool features include, but are not limited to, extra wide tooling support for the substrate around the structured feature to ensure the substrate retains its original profile, with the exception of the stamped pattern. This support can be used to stop the substrates from warping under the stamping force.

Other tooling features may include stamping geometries to avoid material flow into and or to remove unwanted pattern deformation in adjacent structures. Such tooling designs can include tool geometries to overlap with adjacent patterns and or the use of temporary structures proximal to the pattern, but not necessarily overlapping, that allow for material flow during the structuring or subsequent structuring processes. Examples of these geometries for improved channel formation are shown in FIGS. 17A and 17B. FIG. 17A illustrates the top view of a stamping tool (170) having a raised pattern (171) with relief structures (172) for channel formation. When the tool pattern is depressed into the substrate (173) and the formed pattern (174) overlaps an existing pattern (175) then instead of material shifting into the existing pattern's channel structure (175), the material flow (176) moves into the formed relief structures (177). As illustrated therein, the overall pattern (P) is formed from subpatterns (173a, 178b) that have an overlapping region (178c).

FIGS. 18B-18B illustrate an example in which an extra deep or wide stamping pattern (180) on a tool (181) can be used to emboss a structure (182) in a substrate (183) near the point of overlap from successive stamping actions to allow material to flow into these temporary formed structures (184). As illustrated, overall pattern (P) is formed from subpatterns (186a, 186b) that have an overlapping region (186c).

In some stamping processes, materials are deposited on or into a substrate. In these processes, specialised features can be used to anchor the material into the substrate and or into the overlapping sub-pattern. Such anchoring features are particularly useful for joining conductive materials. In the example of FIG. 19A-19B, a patterned tool (190) is used to pattern and anchor a conductive foil (191) onto a substrate (192), and joining overlapping pieces of conductive foil (193, 194) when hot foil stamping can include the use of protuberances such as raised pins or punches (195) on the tool (190) to deform and optionally perforate (196) the material at one edge and push it into an overlapping patterned foil during the stamping process. Such a deformation step may result in complete perforation of the material, or it may simply bring two layers of material into engagement, for example, a mechanical fit. The two layers may have been separated by one or more other layers prior to this step and the deformed layer may be deformed so as to push through such layers to engage the other layer.

Microfluidic devices and/or components formed according to embodiments of the invention are shown in FIGS. 20-24. Microfluidic components can be fabricated by the present invention for example by stamping a substrate using the arrangements and techniques described herein, then sealing the formed channels by bonding another part to the substrate.

Figure 20:
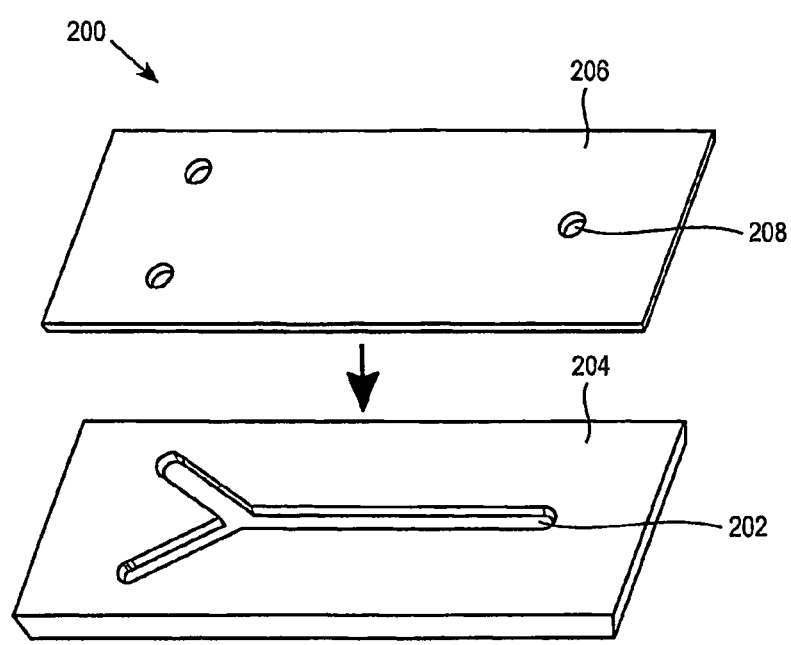
FIG. 20 is a perspective view of a microfluidic device formed according to the present invention.
Figure 21:
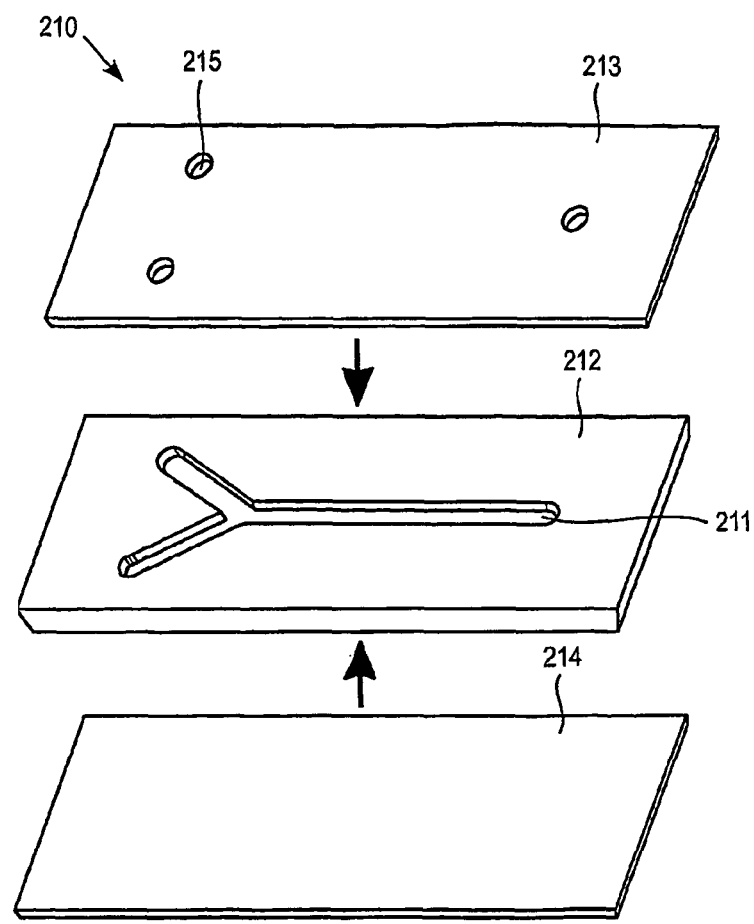
FIG. 21 is a perspective view of a multilayer microfluidic device formed according to a further aspect of the present invention.

FIG. 20 shows a microfluidic device (200) with embossed channels (202) in a substrate (204) that are sealed by laminating, or bonding, another layer (206) with access ports (208) to the structured channels (202). FIG. 21 shows a similar device 210 that has structured channels (211) which were cut entirely through the substrate (212) and then subsequently sealed by bonding other layers (213, 214) on the top and bottom surfaces, with the upper layer containing access ports (215).

Figure 22:
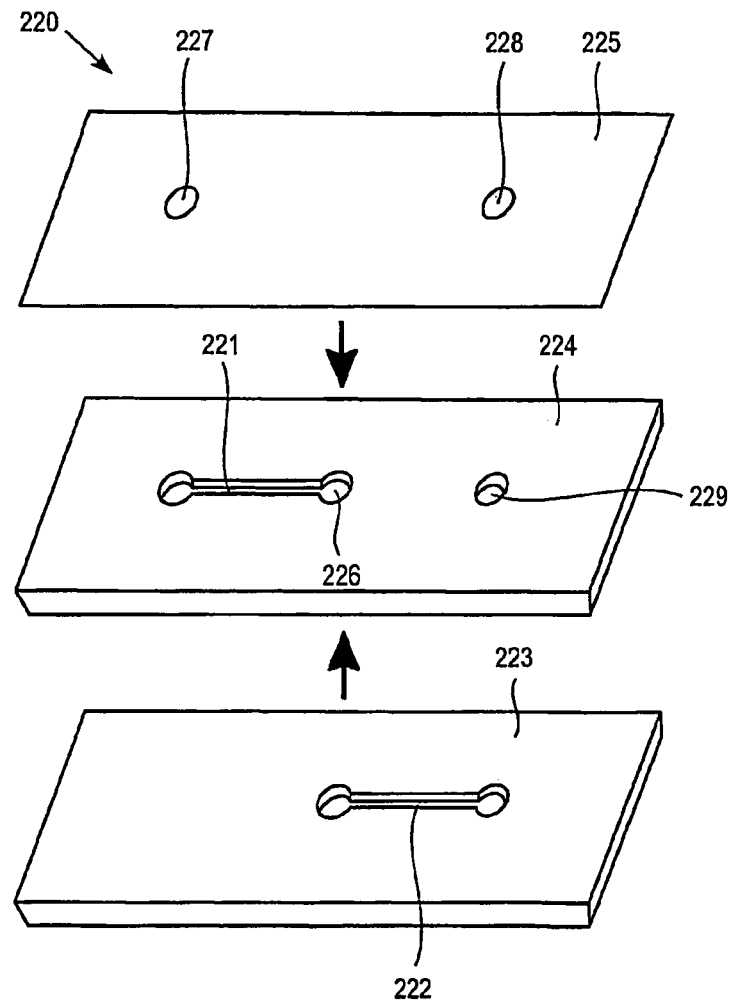
FIG. 22 is a perspective view of a multilayer microfluidic device formed according to another aspect of the present invention.

FIG. 22 illustrates a 3-layer device (220) with channels (221, 222) embossed into the top surfaces of the bottom two substrates (223, 224), with an interconnecting hole (226) through the middle substrate (224), and access ports (227, 228, 229) through the middle (87) and top layers (88).

Figure 23:
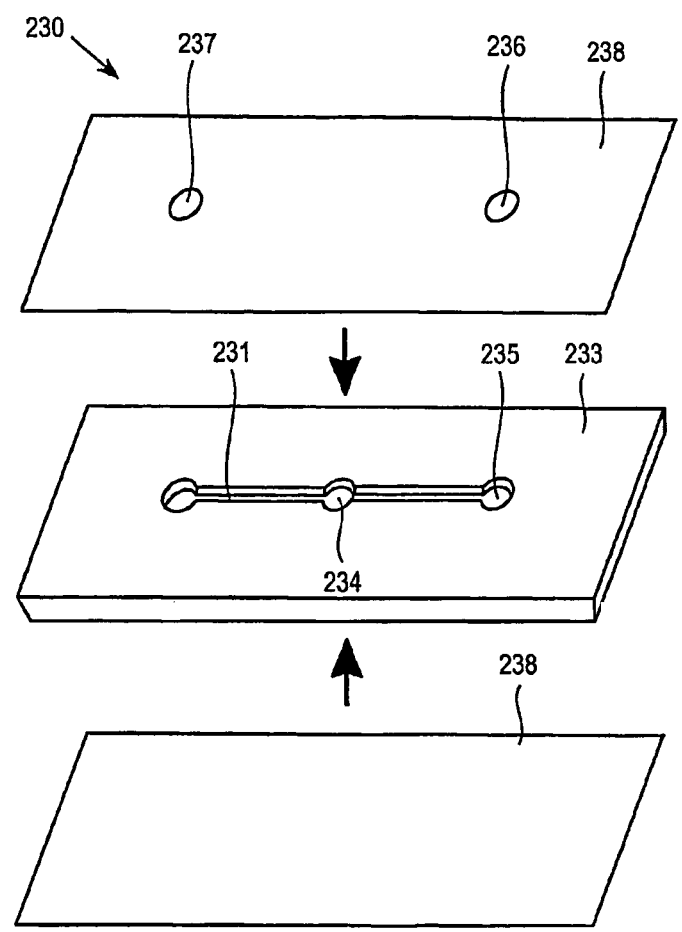
FIG. 23 is a perspective view of a multilayer microfluidic device formed according to yet another aspect of the present invention.
Figure 24:
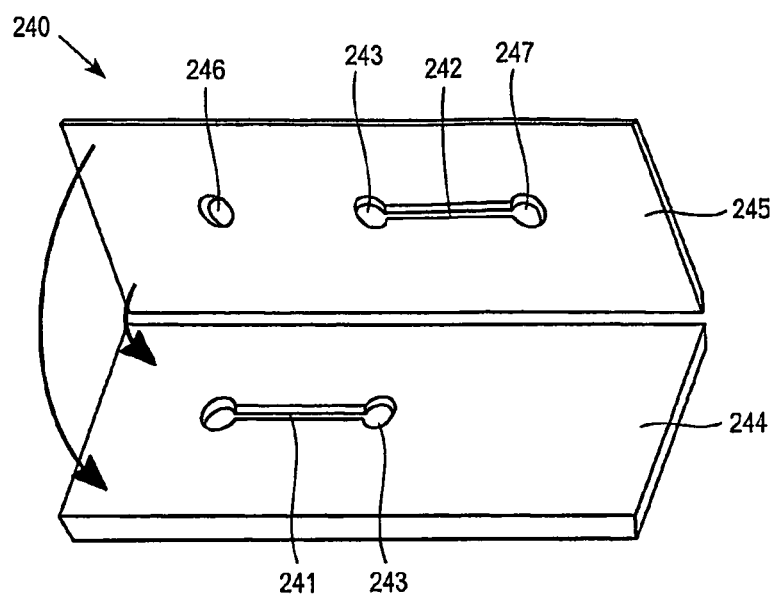
FIG. 24 is a perspective view of a multilayer microfluidic device formed according to a further aspect of the present invention.

FIG. 23 illustrates a similar device (230) in which the embossed channels (231, 232) on the top and bottom surfaces of the middle substrate (233) communicate via port (234). Access to the channel structure is provided at the ends by ports (235, 236, 237) through layers (233, 238). FIG. 24 illustrates a device (240) with embossed channels (241, 242) on the two adjacent surfaces between the top and bottom layers (244, 245). When bonded the structures are joined by the overlapping region (243) and access to structure is provided through ports (246, 247).

In another aspect of the invention, embossed channels are formed in the substrate using the arrangements and techniques described herein which are then filled with another material by a suitable technique such as doctor blade coating, as illustrated in FIG. 25A-25C. This is particularly useful for microoptic or waveguide fabrication and conductive track formation for electronic circuits and heat conductive areas. In this example, a multilayered substrate (250) with an embossed channel (252) (FIG. 25A) is filled with a liquid (254) with the aid of a doctor blade (256) (FIG. 25B) to produce a waveguide (258) in the substrate (250) (FIG. 25C).

Figure 26:
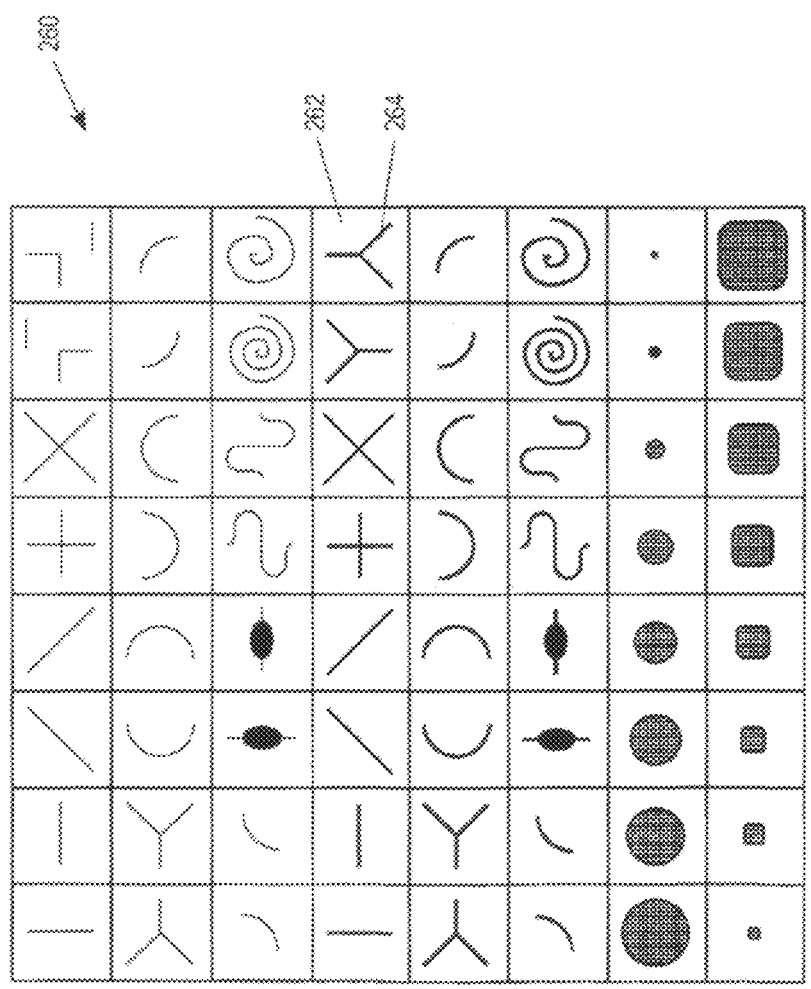
FIG. 26 is a schematic illustration of a stamping tool set for forming microfluidic devices.

In its simplest and most generic form a stamping pattern for microfluidics could be a single dot or square that is replicated many times, overlapping to form the desired pattern. For faster and better structure replication a more specific tool set (260) can be constructed. An example of a stamping tool set for microfluidic fabrication is illustrated in FIG. 26, where each element in the grid represents a separate tool (262) with a patterning structure (264).

Figure 27:
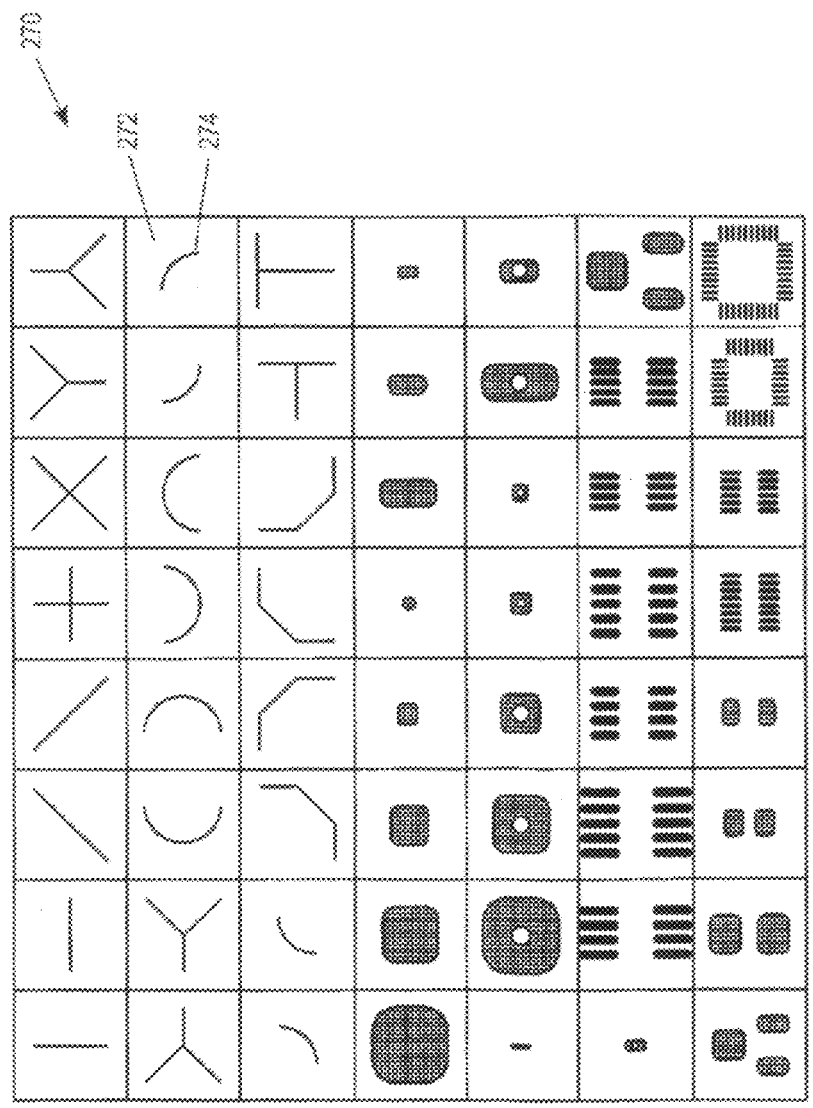
FIG. 27 is a schematic illustration of a stamping tool set for forming printed circuits.

In another preferred embodiment the structuring tool is used for electronic circuit fabrication. Electrically conductive materials are embossed or stamped into the part, or used to fill the embossed regions, to provide electrical circuit connectivity within the device. An example of a stamping tool set (270) for circuit board fabrication is illustrated in FIG. 27, in which each element in the grid represents a separate tool (272) with a patterning structure (274).

Figure 28:
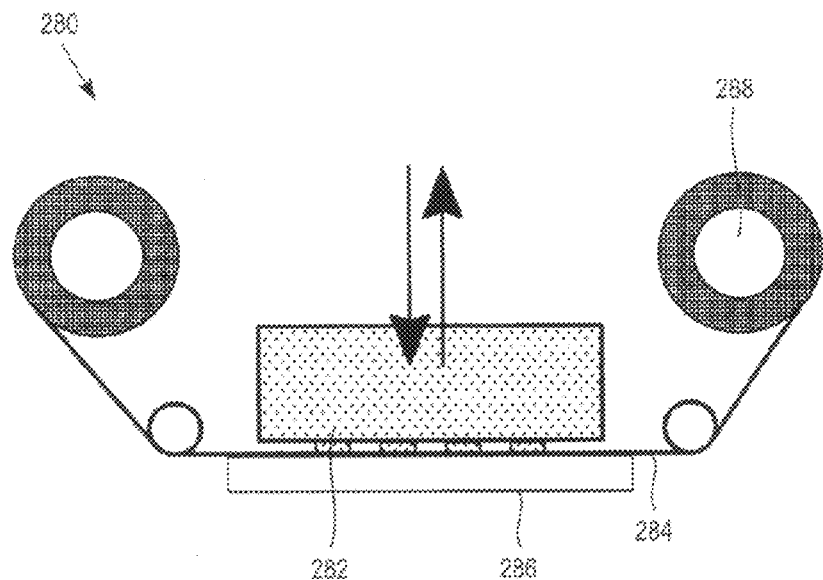
FIG. 28 is a schematic illustration of an arrangement and technique for hot foiling stamping according to the principles of the present invention.

To further explain this aspect of the invention, an exemplary embodiment employs a technique similar to hot foil stamping to form the electrical connections. FIG. 28 illustrates and arrangement 280 including a heated stamp (282) pressing the foil (284), onto a reel to reel system (288), onto the substrate surface (286) transferring a matching pattern from the release layer onto the substrate's surface. For electrode formation where a thicker conductive layer is required, then multiple stamped layers can be added or the stamped layer can be used as a seed layer from which to electroplate. This simplifies the traditional plating process that requires a mask or lithographic process to produce the patterned substrate.

Figure 30A:
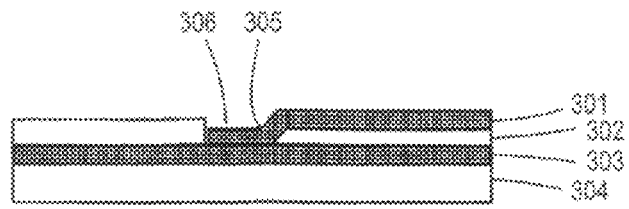
FIGS. 30-30D illustrate cross sections of multilayer circuits manufactured by stamping techniques.
Figure 30B:
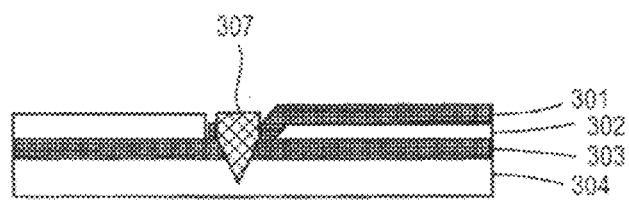
Figure 30C:
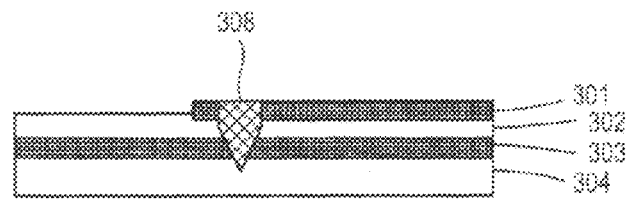
Figure 30D:
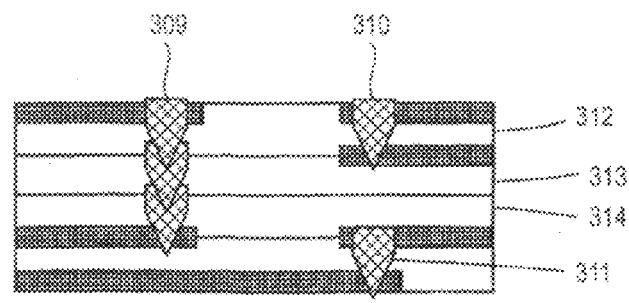

In one embodiment multi-layer printed circuits are fabricated by stamping conductive material onto a substrate and then overlaying a non-conductive material over the stamped conductive material. In this manner many layers of conductive material may be overlain. Interconnects and vias between the conductive layers can be made, for example, by providing areas with non non-conductive material, so that the conductive areas join, or stamping a conductive material through the non-conductive layers to contact the conductive layer below. For example, the cross sections of FIGS. 30A-30D show example cross section segments of multi-layer stamped circuits. FIG. 30A shows a cross section of a two layer circuit formed from two conductive (301, 303) and two non-conductive (302, 304) layers, with an interconnect (305) formed in a region (306) where there is no non-conductive layer (302) and the conductive layers (301, 303) overlap. FIG. 30B shows a similar interconnect as that shown in FIG. 30A in which a conductive material (307), either part of layer (301) or another piece of conductive material, is stamped into the bottom conductive layer (303) to form a more robust interconnect. FIG. 30C shows no opening in the non-conductive layer (302), but where the conductive material (308) is stamped through the non-conductive layer (302) to provide an electrical interconnect between the conductive layers (301, 303). FIG. 30D shows a cross section segment of a multi-layer circuit containing three stamped interconnects (309, 310,311) in which one interconnect (309) passes through three non-conductive layers (312, 313, 314). These multi-layer interconnects may be performed with one stamping action which perforates all three layers or by multiple overlapping stamping actions performed on different layers.

In another embodiment of the invention, structuring of a substrate using the arrangements and techniques of the present invention may be used to form, or be a part of the forming process, for providing heat conductive structures on a device. Heat conductive layers are important for controlling heat flow in both microfluidic and electronic circuits. According to one exemplary embodiment, heat conductive materials are embossed into or onto the part, or embossed regions are filled with conductive material to provide improved thermal control within the device.

In another embodiment of the invention, the structuring or embossing arrangements and techniques may be used to form, or be a part of the forming process for, electrically conductive areas to guide or block electromagnetic radiation. It is well known that electromagnetic (EM) shielding protects conductive components such as fluidics or electronic circuits, sensors or actuators from Electromagnetic Interference (EMI) and can be used to reduce emissions from on chip components. Other embodiments may use the structured conductive regions to guide EM fields for other purposes, such as with sensors or actuators, an example of which is for the manipulation or sensing of magnetic and or paramagnetic particles.

In another embodiment the invention is used for waveguide, or light pipe, fabrication. In the past typical fabrication methods in microfluidic devices have involved either use of the entire planar material, inserting a fibre optic directly into the sensor system, or lithographically patterning of the surface in a similar manner to the fabrication of semiconductor devices. In one embodiment the waveguide may be formed by the embossed structures being filled by any suitable method, for example, by injecting or coating an optically transparent material inside the channels, or by placing an already formed light pipe into the vacant structures. An example of a channel filled by doctor blade coating is shown in FIGS. 25A-25C, and FIGS. 29A-29C which illustrate the incorporation of prefabricated light pipes into a structured device (290). The example in FIGS. 29A-29C, illustrates the assembly steps for the microfluidic device of containing preformed waveguides (291) inserted into a substrate (292) containing microfluidic structures (293), is shown in FIG. 29B. The preformed waveguides (291) are placed into locating structures (294) in the substrate (292) adjacent to the microfluidic structures (293). A sealing layer (295) is then used to seal the device providing only inlet ports (296) to the microfluidic structures on the top surface (297) and waveguide input and output through the side ports (298).

In other embodiments of the invention, the so produced structures may be cut, rendered or divided into smaller parts.

The stamped parts may be bonded to other components, which may or may not be a continuous substrate, and may or may not be planar, and may be made of single or multiple components.

In other embodiments, the stamping process may be combined with other processes; including but not limited to stamping or embossing processes, structuring processes such as injection molding, micromilling, die cutting, laser processing, embossing, thermoforming, print-head deposition, photolithography, and other structuring methods.

The present invention may also be combined with other processes to facilitate the stamping process. In one embodiment the present invention is combined with a pretreatment process to soften the material prior to stamping (such as embossing) to shorten the residence time and improve the quality of the replicated parts. Pre-treatment processes might for example include either bulk or surface treating methods such as with the use of ovens, IR heaters, chemicals, UV lamps, plasma, lasers and/or surface coatings. Post-treatment processes may also be used, for example to cure, surface treat, coat or render the parts.

The use of alignment marks, notches, grooves, and or edge guides are common approaches used for alignment in many manufacturing systems. In one preferred embodiment of the process, the present invention uses control systems to facilitate alignment and provide quality control. Parameters in the control system include, but are not limited to, mechanical and/or optical sensor feedback with part translation or embossing head adjustment for improved alignment.

Numbers expressing quantities of ingredients, constituents, reaction conditions, and so forth used in this specification are to be understood as being modified in all instances by the term "about". Notwithstanding that the numerical ranges and parameters setting forth, the broad scope of the subject matter presented herein are approximations, the numerical values set forth are indicated as precisely as possible. Any numerical value, however, inherently contains certain errors necessarily resulting from the standard deviation found in their respective measurement techniques.

Although the present invention has been described in connection with preferred embodiments thereof, it will be appreciated by those skilled in the art that additions, deletions, modifications, and substitutions not specifically described may be made without department from the spirit and scope of the invention as defined in the appended claims.

What is claimed is:

1. A method of forming a microfluidic device by using a plurality of stamping tool segments to create a continuous microfluidic pattern stamped on a substrate,
   wherein a first stamping tool segment is applied to at least one surface of the substrate thereby forming a first sub pattern thereon, and applying a second stamping tool segment to the same surface of the same substrate thereby forming a second sub pattern thereon, and
   wherein the first sub pattern and the second sub pattern partially overlap,
   wherein at least one of the stamping tool segments comprises geometries to remove unwanted microfluidic pattern deformation in adjacent structures that may occur during the stamping process.

2. A method of claim 1, wherein at least one of the stamping tool segments comprises geometries that overlap with adjacent patterns to allow for material flow during the second stamping process to retain the continuous microfluidic pattern.

3. A method of claim 1, wherein at least one of the stamping tool segments comprises geometries that create temporary structures proximal to the pattern, to allow for material flow during subsequent stamping processes.

4. A method of claim 1, wherein at least one of the stamping tool segments comprises an extra wide or extra deep geometric feature for creating a temporary structure in the substrate that material from a subsequent stamping process can fill to avoid deforming the microfluidic structures.

5. A method of any of claims 1-4, wherein a stamping toolset for microfluidic device fabrication is provided, wherein a continuous pattern can be fabricated from stamping more than one of the stamping tool segments from a toolset onto the same substrate.

6. The method of any of any of claims 1-4, wherein another stamped sub pattern overlaps on a separate layer of the same substrate,
   wherein the first sub pattern and the second sub pattern are joined together in the overlapping region.

7. The method of any of claims 1-4, wherein at least one of the stamping tool segments comprises an extra wide support for the substrate around the area of the stamped feature to avoid deformation of the substrate and adjacent structures that may occur during the stamping process.

8. The method of any of claims 1-4, wherein the act of applying the stamp pattern deposits material onto at least one surface of the substrate.

9. The method of claim 8, wherein the deposited material comprises at least one of: a metallic electrically conductive material; a chemical or biological reagent for surface treatment; a material comprising at least part of an actuator or sensor; and an optical material for forming part of a waveguide.

10. The method of any of claims 1-4, wherein the substrate comprises: silicon; a polymer; a metal; a metal oxide; paper; nitrocellulose; glass; photoresist; ceramic; wood; fabric-based products; and/or combinations thereof.

11. The method of any of claims 1-4, wherein the stamped feature has one dimension of 0.1 to 1000 microns.

12. The method of any of claims 1-4, further comprising treating the substrate prior to stamping optionally with one or more of: ovens; IR heaters; chemicals; UV lamps; plasma, lasers, and/or surface coatings.

13. The method of any of claims 1-4, further comprising treating the substrate after stamping optionally with one or more of: IR heaters; chemicals; UV lamps; plasma; lasers; curing; and surface coatings.

14. The method of any of claims 1-4, wherein a stamped structures are joined together in the overlapping region by one or more structures fabricated in the substrate by one or more of: injection molding, micromilling; die cutting; laser processing; thermoforming; and photolithography.

15. A method of any claims 1-4, wherein the stamping tool presses a material onto or into the substrate surface leaving subdeposits which together form a patterned area of deposited material.

16. A method of claim 15, wherein a metal is deposited forming an electronic circuit.

17. A method of any of claims 1-4, wherein a multi-layered device is formed by stamping two adjacent surfaces prior to bonding the surfaces together.

18. A method of any of claims 1-4, wherein the application of the stamping tool segments applies overlapping sub patterns of a metallic electrical conductive interconnect onto the microfluidic device.

19. A method of claim 18, wherein the application of the metallic electrical conductive interconnect comprises stamping a part of a metallic conductive material through a non-conductive layer on the microfluidic device.

20. A method of any of claims 1-4, wherein the application of the stamping tool segments forms a pattern that is used as part of a waveguide within the microfluidic device.

21. A method of any of claims 1-4, wherein the application of the stamping tool segments applies overlapping sub patterns of metallic patterned areas of greater heat conduction than the substrate onto the microfluidic device.

22. A method of any of claims 1-4, wherein the application of the stamping tool segments applies overlapping sub patterns of metallic patterned areas of greater electrical or magnetic shielding within the microfluidic device.

23. A method of any of claims 1-4, wherein the application of the stamping tool segments applies overlapping sub patterns of a surface treating by chemical modification patterned areas on the microfluidic device.

24. A method of any of claims 1-4, wherein the application of the stamping tool segments applies overlapping sub patterns that form part of a sensor on the microfluidic.

25. A method of any of claims 1-4, wherein the application of the stamping tool segments applies overlapping sub patterns that form a part of an actuator on the microfluidic device.

* * * * *